US008717216B1

(12) United States Patent
Motamed

(10) Patent No.: US 8,717,216 B1
(45) Date of Patent: May 6, 2014

(54) CIRCULAR RESISTOR STRING DIGITAL-TO-ANALOG CONVERTER

(71) Applicant: Apple Inc., Cupertino, CA (US)

(72) Inventor: Ali Motamed, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/712,306

(22) Filed: Dec. 12, 2012

(51) Int. Cl.
*H03M 1/78* (2006.01)
(52) U.S. Cl.
CPC ........................................ *H03M 1/78* (2013.01)
USPC .......................................... 341/154; 341/155
(58) Field of Classification Search
CPC ....................................................... H03M 1/78
USPC .................................................. 341/144, 154
See application file for complete search history.

(56) References Cited

U.S. PATENT DOCUMENTS

| 4,459,580 | A | * | 7/1984 | Furukawa | ...................... 341/144 |
| 6,567,026 | B1 | | 5/2003 | Gorman | |
| 6,621,440 | B2 | * | 9/2003 | Gorman | ........................ 341/154 |
| 7,283,079 | B2 | | 10/2007 | Jain | |
| 7,652,606 | B2 | * | 1/2010 | Itoh et al. | ...................... 341/144 |

* cited by examiner

*Primary Examiner* — Brian Young
(74) *Attorney, Agent, or Firm* — Lawrence J. Merkel; Meyertons, Hood, Kivlin, Kowert & Goetzel, P.C.

(57) ABSTRACT

A differential digital-to-analog converter (DAC) is disclosed. In one embodiment, a DAC includes a number of resistor networks coupled in series to form a ring, and a digital decoder configured to receive a digital code. Based on the most significant bits of the digital code, the digital decoder is configured to close selected ones of first and second groups of switches to couple first and second reference voltage nodes to corresponding tap points on the ring. Within the number of networks are first and second output circuits, each of which is arranged as a one-hot multiplexer. Based on the least significant bits of the digital code, the decoder is configured to couple respective tap points in the ring to first and second output voltage nodes in order to provide a differential output voltage based on the digital code.

22 Claims, 7 Drawing Sheets

CIRCULAR RESISTOR STRING DIGITAL-TO-ANALOG CONVERTER

BACKGROUND

1. Technical Field

This disclosure is directed to electronic circuits, and more particularly, to digital-to-analog converter (DAC) circuits.

2. Description of the Related Art

A digital-to-analog converter (DAC) is an electronic circuit configured to convert a digital input word (or code) into an analog output voltage. A differential DAC is configured to convert a digital input word into a differential analog output voltage. For an N bit differential DAC, the output voltages may be expressed as follows:

$$V_p = VREFB + (VREFT - VREFB) \sum_{i=0}^{N-1} b(i) \times 2^i$$

$$V_n = VREFB + (VREFT - VREFB) \sum_{i=0}^{N-1} \overline{b(i)} \times 2^i$$

where VREFB and VREFT are reference voltages, and where each $b(i)$ for $i=0$ to $N-1$ are the digital input bits.

Various DAC implementations, both differential and single ended, are possible. One type of DAC implementation is a resistor string DAC, or R-DAC, which utilizes one or more networks of series-coupled resistors. A simple R-DAC configured to convert an N-bit code into an analog voltage can be implemented using a series string of $2^N$ resistors and an array of switches. Using the digital code, a single one of the switches may be closed to tap a point on the string of $2^N$ resistors. Thus, for an exemplary embodiment in which $N=12$, a string of 4096 ($2^{12}=4096$) resistors may be coupled in series, and the output voltage may be generated by tapping one point in the resistors string by closing a corresponding switch according to a digital code.

A segmented R-DAC may be similar to the simple R-DAC described above, but may divide the resistor string into segments. For example, an R-DAC may be implemented with two segments, of M bits and L bits, where $N=M+L$. A first segment may have $2^M$ resistors, while a second segment may have $2^L$ resistors. Thus, using the example above where $N=12$, a segmented R-DAC can be implemented with $M=6$ and $L=6$. Thus, each segment would include $2^6=128$ resistors. Thus, a segmented 12-bit R-DAC can be implemented using 256 resistors. A segmented R-DAC may include buffers between the segments to combat the effects of loading.

SUMMARY

A digital-to-analog converter (DAC) is disclosed. In one embodiment, a DAC includes a resistor segments each coupled together in series and forming a ring. The DAC also includes a number of switches each coupled between a corresponding tap point in the resistor segments and first reference voltage node, and a number of switches each coupled between a corresponding tap point in the plurality of resistor segments and a second reference voltage node. A first output circuit is implemented using one of the resistor segments and a one-hot multiplexer structure arranged to couple a first output voltage node to the ring, while a second output circuit is implemented using another one of the resistor segments and another one-hot multiplexer structure arranged to couple a second output voltage node to the ring. A decoder circuit may close various switches of DAC structure, including those in the one-hot multiplexers, to generate output voltages on the voltage output nodes, which collectively result in a differential output voltage.

In one embodiment, a decoder may control switches of first and second groups to couple first and second reference voltage nodes to selected tap points in a resistive ring of a DAC. The resistive ring may be a group of resistors or resistor networks arranged in a ring topology. Coupling the first and second reference voltage nodes to selected tap points in the resistive ring based on the most significant bits of a digital code may provide coarse-grain control of a differential output voltage. Within the resistive ring may be two special groups of resistors, with switches coupled between tap points of these resistors and an output voltage node. Fine-grain control of the differential output voltage may be obtained by coupling one tap point of a first one of these special resistor groups (which may be referred to as 'verniers') to a first output voltage node, and coupling one tap point of a second one of the special resistor groups to a second output voltage node. The particular switches closed in the special resistor groups may be determined by the least significant bits of the digital code.

BRIEF DESCRIPTION OF THE DRAWINGS

The following detailed description makes reference to the accompanying drawings, which are now briefly described.

Figure 1:
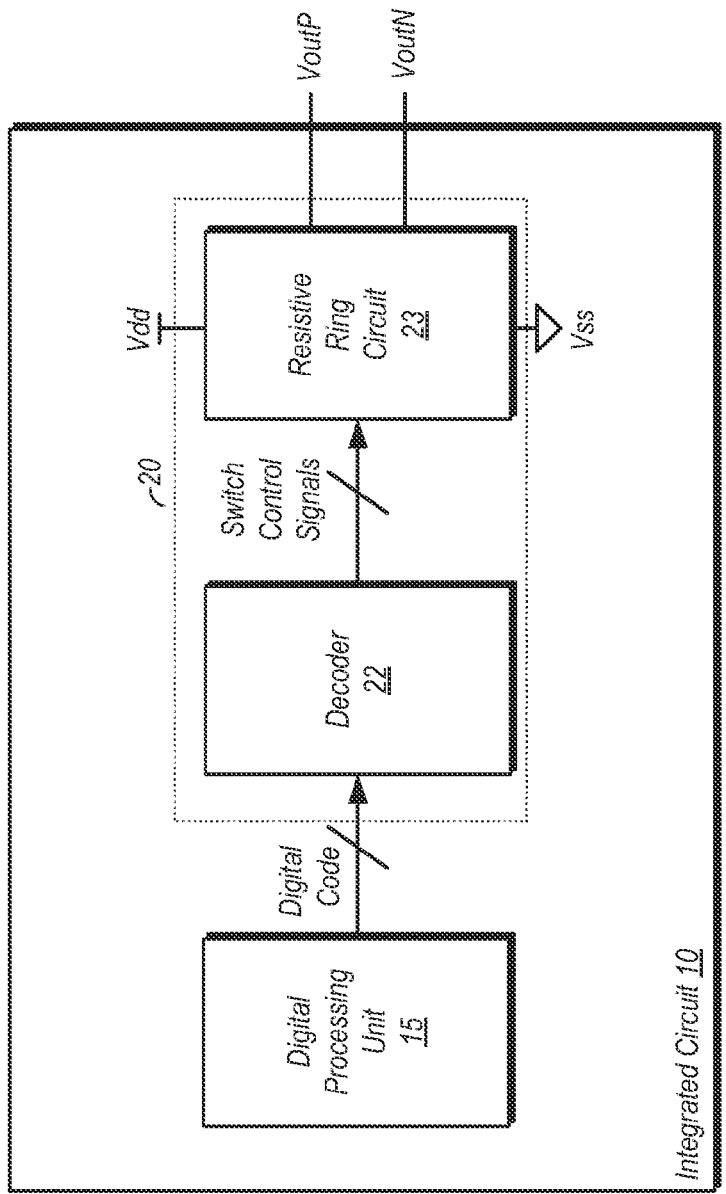
FIG. 1 is a block diagram of one embodiment of an integrated circuit (IC) including a digital-to-analog converter (DAC).

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/ components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

FIG. 1 is a block diagram of one embodiment of an integrated circuit (IC). In the embodiment shown, IC 10 includes a digital processing unit 15 that is configured to perform various functions. Such functions may include digital audio processing, digital video processing, or various other types of processing.

At least some of the information processed by digital processing unit 15 may be intended for conversion to analog form. In the embodiment shown, IC 10 includes a digital-to-analog converter (DAC) 20 configured to convert a digital code into an analog voltage. In this particular embodiment, DAC 20 is configured to generate a differential output voltage, although in other implementations, DAC 20 may be configured/arranged to provide a single-ended output voltage.

DAC 20 in the embodiment shown includes a digital decoder 22 and a resistive ring circuit 23 (which is explained in further detail below). Digital decoder 22 in the embodiment shown is coupled to receive a digital code from digital processing unit 15 and is configured to convert the digital code into switch control signals. The switch control signals may activate switches at various tap points in resistive ring circuit 23. Based on the particular switches activated, the output voltages VoutP and VoutN may be generated, and thus may collectively provide a differential output voltage.

Figure 2:
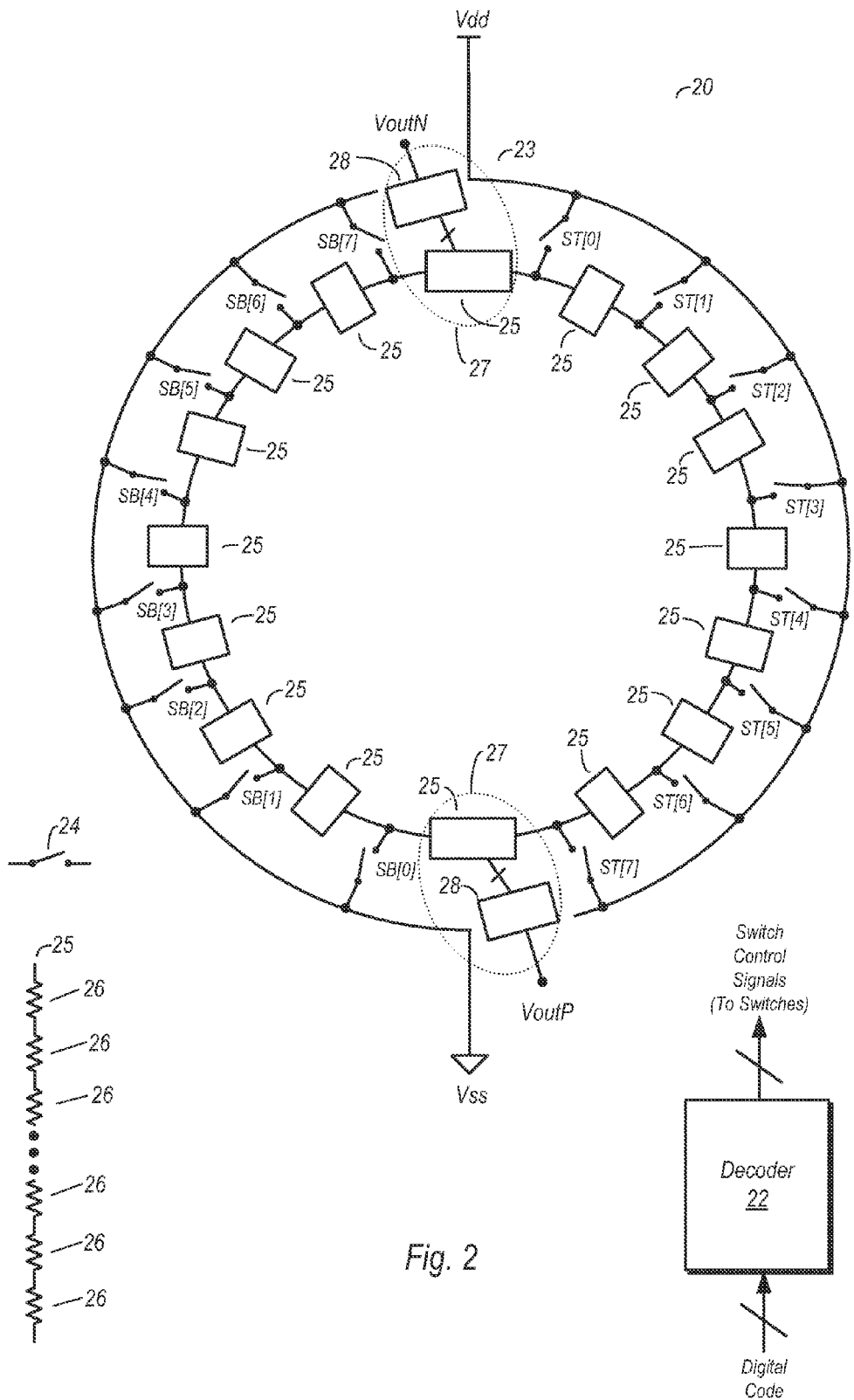
FIG. 2 is a schematic diagram illustrating one embodiment of a DAC implemented using a resistive ring.

FIG. 2 is a schematic diagram illustrating one embodiment of a DAC implemented using a resistive ring. In the embodiment shown, DAC 20 includes a resistive ring 23 including a number of resistor networks 25 coupled in series. An exemplary resistor network 25 is shown in the lower left-hand corner of the drawing. As shown in the drawing, the exemplary resistor network 25 is a number of resistors 26 coupled together in series. Thus, resistive ring 23 is effectively a number of resistors coupled together in series in such a manner as to form a closed ring.

Resistive ring 23 in the embodiment shown also includes a number of switches 24. A first voltage reference node, Vdd, may be coupled to various tap points in the circular string of resistor networks 25 via any one of switches ST[7:0]. A second voltage reference node, Vss, may be coupled to various tap points in the circular string of resistor networks 25 via any one of switches SB[7:0]. During operation, decoder 22 may, based on the most significant bits of the received digital code, close one switch coupled to Vdd and one switch coupled to Vss. The other switches coupled to the reference voltage node may remain open. The closing of one switch 24 coupled to each of the reference voltage nodes based on the most significant bits of the digital code may provide coarse-grain control of the output voltage.

Figure 3:
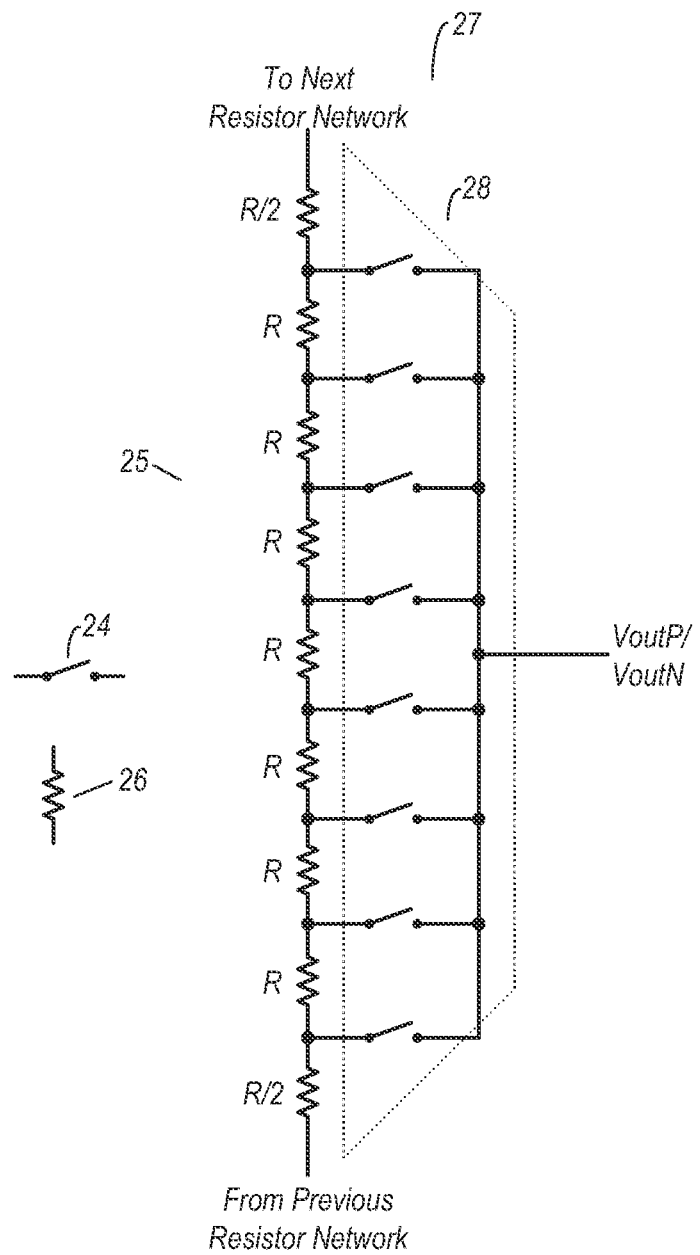
FIG. 3 is a schematic diagram illustrating one embodiment of an output circuit of a DAC implemented using a resistive ring.

Within resistive ring 23, there are two resistor networks 25 that are each part of a respective one of two output circuits 27. Turning momentarily to FIG. 3, a schematic diagram of one embodiment of an output circuit 27 is shown. Output circuit 27 as illustrated in FIG. 2 includes a series string of resistors 25. The resistors on the extreme ends of the string have a resistive value of R/2, while the remaining resistors have a resistive value of R. The value of R may be any suitable resistance value for the application in which the DAC is to be implemented.

Collectively, switches 24 in the embodiment shown implement a one-hot multiplexer 28. Each of the switches 24 is coupled between a tap point (i.e. a junction between two resistors 26) and an output voltage node. One instance of output circuit 27 in the embodiment of FIG. 2 is coupled to provide an output voltage VoutP, while the other output circuit 27 is coupled to provide an output voltage VoutN.

During operation, for a particular received digital code, decoder 22 is configured to close one of switches 24 in each one-hot multiplexer 28. Thus, one tap point, and the voltage thereon, is coupled to the output voltage node of that particular instance of output circuit 27. The switch 24 to be closed in each given instance of output circuit 27 may be selected based on the least significant bits of the digital code received by decoder 22. Whereas closing of selected ones of switches 24 coupled to the reference voltage nodes provides coarse-grain control of the output voltages, closing selected ones of switches 24 in each of the output circuits 27 may provide fine-grain control of the output voltages.

Thus, the operation of DAC 20 as shown in FIG. 2 can be summarized as follows. Responsive to receiving a digital code, decoder 22 generates switch control signals to close one each of four different groups of switches. Based on the most significant bits of the digital code, decoder 22 may provide control signals to close one of switches SB[7:0] and one of switches ST[7:0] Based on the least significant bits of the digital code, decoder 22 may provide control signals to close, in each of the two instances of output circuit 27, one switch 24 may be closed to coupled a tap point of a respective resistor network to a corresponding output voltage node.

Table 1 illustrates the switch closings for switches coupled to the reference voltage nodes in one embodiment having three most significant bits. Switches ST[7:0] are coupled between Vdd and corresponding tap points in resistive ring 23, while switches SB[7:0] are coupled between Vss and corresponding tap point in resistive ring 23.

TABLE 1

| MSB Bits | ST[7:0] | SB[7:0] |
|---|---|---|
| 000 | 00000001 | 00000001 |
| 001 | 00000010 | 00000010 |
| 010 | 00000100 | 00000100 |
| 011 | 00001000 | 00001000 |
| 100 | 00010000 | 00010000 |
| 101 | 00100000 | 00100000 |
| 110 | 01000000 | 01000000 |
| 111 | 10000000 | 10000000 |

Table 2 illustrates the switch closings in the output circuits 27 (and more particularly, in the one-hot multiplexers 28 of output circuits 27) in one embodiment having three least significant bits. Each of the switches is coupled between one tap point within a corresponding resistor network 25 and the voltage output node.

TABLE 2

| LSB Bits | S[7:0] |
|---|---|
| 000 | 00000001 |
| 001 | 00000010 |
| 010 | 00000100 |
| 011 | 00001000 |
| 100 | 00010000 |

TABLE 2-continued

| LSB Bits | S[7:0] |
|---|---|
| 101 | 00100000 |
| 110 | 01000000 |
| 111 | 10000000 |

In various embodiments, the output voltages on output voltage node VoutP and VoutN may depend on the particular ones of the switches that are closed, in addition to the voltages present on the reference voltage nodes Vdd and Vss. More particularly, the particular switches closed within the ring of resistive networks 25, including those within output circuits 27 determines the amount of resistance between the reference voltage nodes and the output voltage nodes. The closing of particular switches effectively creates a voltage divider between Vdd and Vss, with VoutP and VoutN being tap points within the voltage divider. Thus, VoutP and VoutN depend on the particular points tapped by the particular switches closed in the circuit.

In the embodiment shown in FIG. 2, DAC 20 is configured to convert a 6-bit digital code into a differential analog voltage. The 6-bit code is divided into three most significant bits and three least significant bits. Generally speaking, a DAC 20 may be implemented as an N-bit DAC, wherein N=M+L, wherein M is the number of most significant bits and L is the number of least significant bits, and wherein N, M, and L are integer values. It is further noted that, while M and L are equal in the specific embodiments discussed herein, embodiments where these values are not equal are possible and contemplated.

The resistive ring 23 may have a total of $2^{M+1}$ resistor networks 25, including $2^{M+1}-2$ resistor segments outside of the output circuits 27 and two resistor networks 25 within each output circuit 27. The one-hot multiplexer within each output circuit 27 may be a $2^L$-to-1 multiplexer, and may include $2^L+1$ resistors. In some embodiments, the resistor networks 25, both within and without of control circuits 27, may be closely matched in terms of electrical characteristics, and thus may each include $2^L+1$ resistors. However, embodiments wherein the number of resistors 26 are not equal for all of the resistor networks 25 are possible and contemplated.

Figure 4:
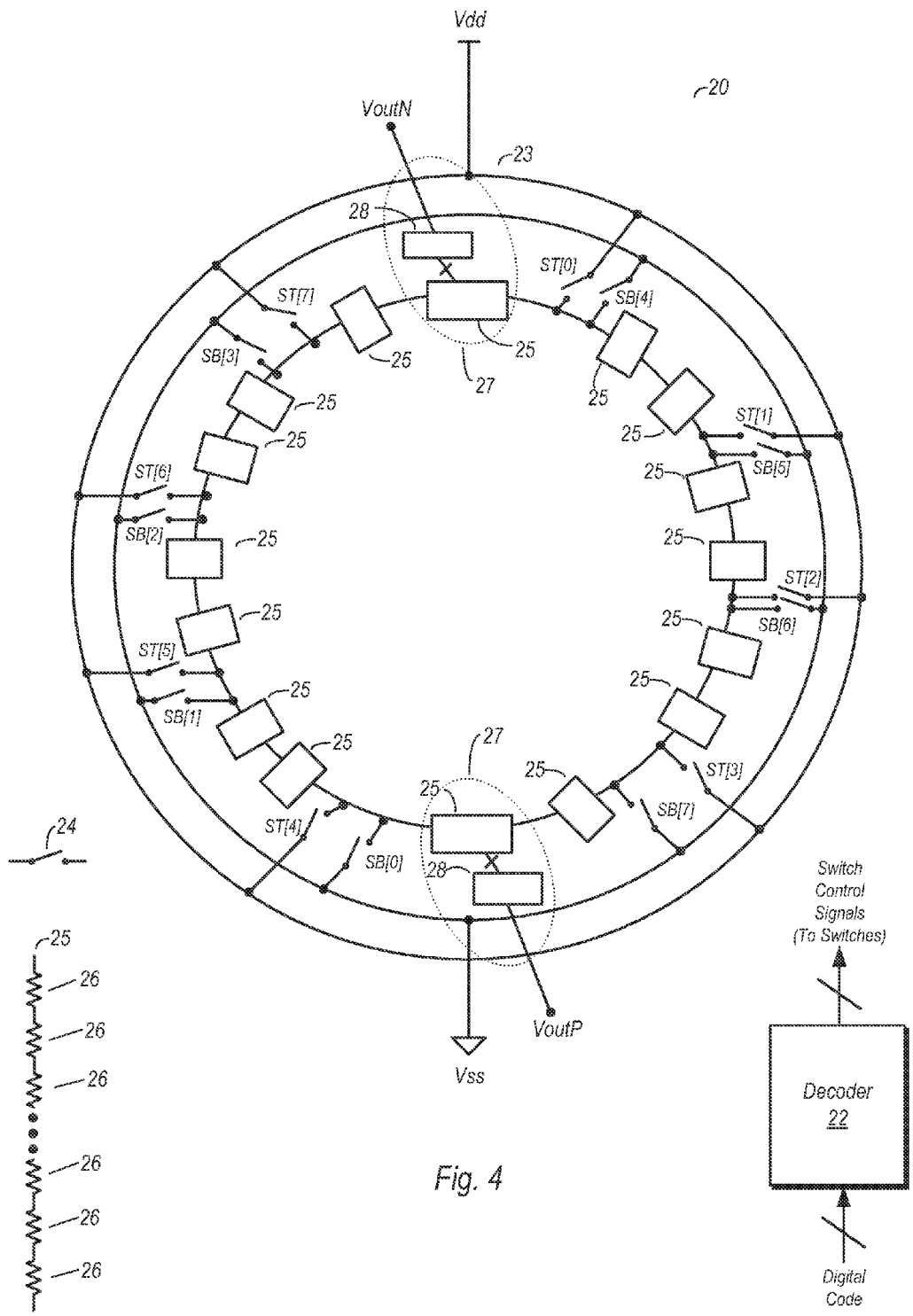
FIG. 4 is a schematic diagram illustrating a second embodiment of a DAC implemented using a resistive ring.

FIG. 4 illustrates another embodiment of a DAC 20. The primary difference between DAC 20 in FIG. 4 and that shown in FIG. 2 is the position of the switches 24 in the main portion of resistive ring 23, i.e. switches ST[7:0] and SB[7:0]. For the sake of explanation, the embodiment shown in FIG. 2 may be said to utilize straight coding, whereas the embodiment shown in FIG. 4 may be said to utilize zig-zag coding. The switch closings for the embodiment shown in FIG. 4 are shown in Table 3 below.

TABLE 3

| MSB Bits | ST[7:0] | SB[7:0] |
|---|---|---|
| 000 | 00000001 | 00000001 |
| 001 | 10000000 | 10000000 |
| 010 | 00000010 | 00000010 |
| 011 | 01000000 | 01000000 |
| 100 | 00000100 | 00000100 |
| 101 | 00100000 | 00100000 |
| 110 | 00001000 | 00001000 |
| 111 | 00010000 | 00010000 |

Decoder 22 in this embodiment may invert the LSB bits according to the value of a least significant one of the most significant bits. For example, if N=6, M=3, and L=3, the three least significant bits L may be inverted based on M[0], where M[0] is the least significant of the bits M[2:0]. Generally, this can be described using the following equation:

$$b^*(i) = b(i) \oplus b(L)$$

for i=0 to L−1, wherein b*(i) is resulting LSB bit value that determines a corresponding switch setting in the one-hot multiplexers 28, and b(L) is the value of the least significant one of the most significant bits. The switch closings in the one-hot multiplexers 28, based on the transitions of the most significant bits (and corresponding least significant bits generated on the formula above) of the embodiment of FIG. 4 (where M=3 and L=3) are shown in Table 4.

TABLE 4

| MSB Bits b*(i) | S[7:0] |
|---|---|
| 000 | 00000001 |
| 001 | 00000010 |
| 010 | 00000100 |
| 011 | 00001000 |
| 100 | 00010000 |
| 101 | 00100000 |
| 110 | 01000000 |
| 111 | 10000000 |

Figure 5:
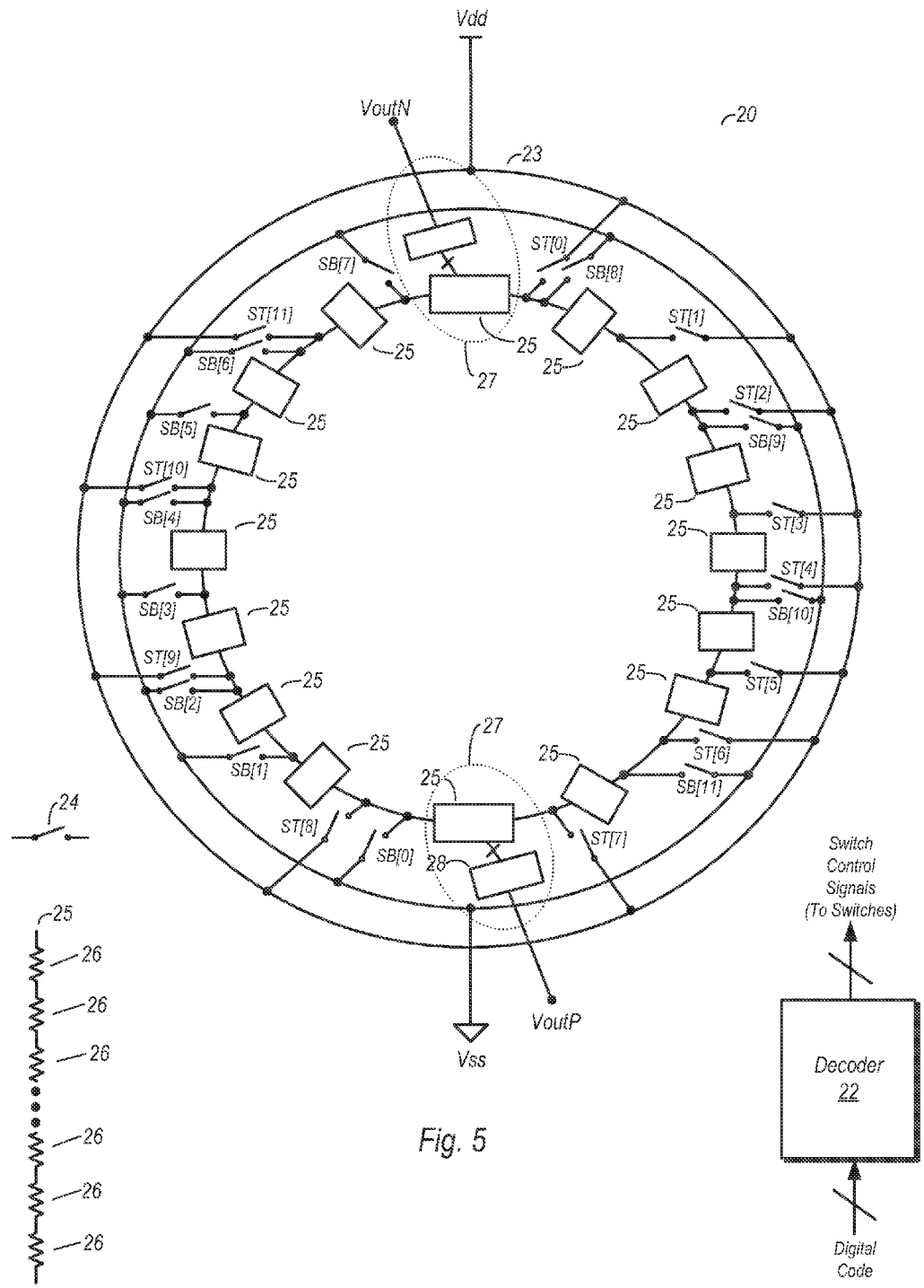
FIG. 5 is a schematic diagram illustrating a second embodiment of a DAC implemented using a resistive ring.

FIG. 5 illustrates yet another embodiment of DAC 20. More particularly, the embodiment of DAC 20 shown in FIG. 5 may be considered to be a combination of the embodiments shown in FIGS. 2 and 4. In particular, the embodiment of DAC 20 shown in FIG. 5 may operate according to the straight encoding of the embodiment in FIG. 2, or according to the zig-zag encoding of the embodiment of FIG. 4.

When the embodiment shown in FIG. 5 is operating in the straight encoding mode, the embodiment shown in FIG. 5 may utilize switches SB[7:0] and switches ST[7:0]. The switches may be closed and opened in accordance with Tables 1 and 2. Furthermore, when operating in the straight encoding mode, switches SB[11:8] and switches ST[11:8] are not used, and may thus remain open.

When the embodiment shown in FIG. 5 is operating in the zig-zag encoding mode, switches SB[11:8] are substituted for SB[1], SB[3], SB[5], and SB[7], the latter of which are not used and remain open. Similarly, switches ST[11:8] are substituted for ST[1], ST[3], ST[5], and ST[7], with the latter switches remaining open. The switches may be open and closed in accordance with Tables 3 and 4. Decoder 22 in the embodiment of FIG. 5 may be configured to switch between the two modes, and switch its encoding accordingly.

Figure 6:
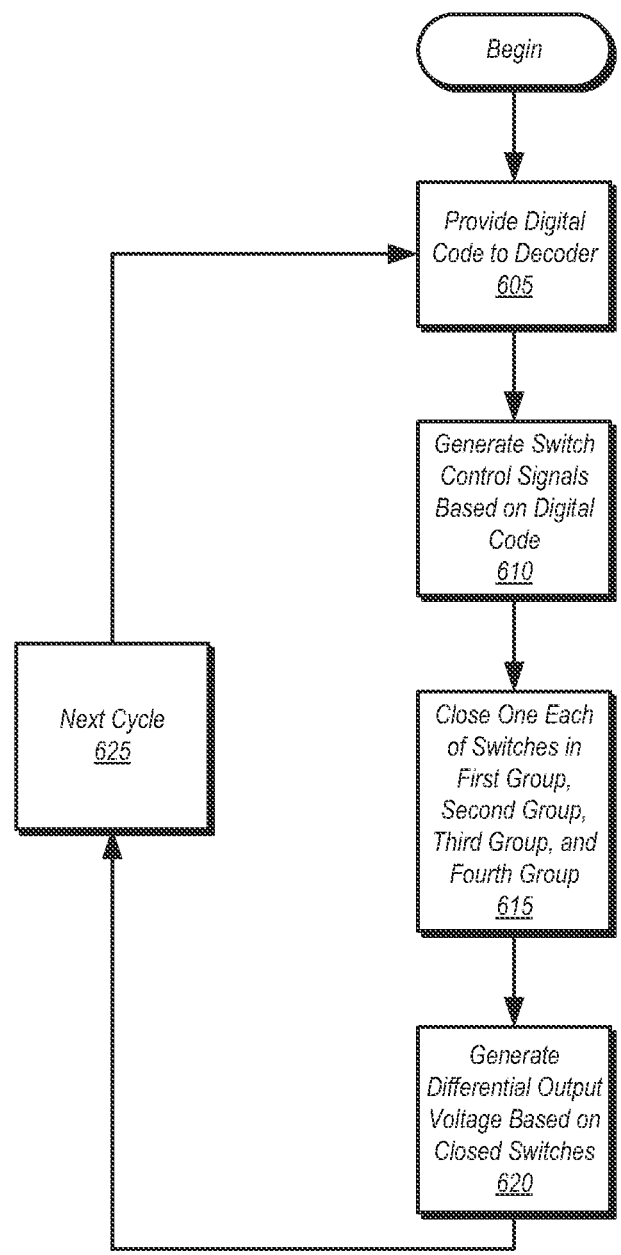
FIG. 6 is a flow diagram illustrating one embodiment of a method for operating a DAC.

FIG. 6 is a flow diagram illustrating one embodiment of a method for operating a DAC. Method 600 may be performed on any of the DAC embodiments discussed above, or other DAC embodiments not explicitly discussed herein.

Method 600 begins with the providing of a digital code to a decoder (block 605). Based on the digital code, the decoder may generate control signals for closing various switches in the DAC (block 610). Responsive to the generation of the switch control signals, one switch each in a first group, a second group, a third group, and a fourth group may be closed (block 615). The closing of the switches in the first and second groups may connect first and second reference voltage nodes, respectively, to tap points in a resistive ring having a number of resistor networks coupled together in a closed ring. The closing of switches in the third and fourth groups may couple first and second output voltage nodes, respectively, to resistors in the resistive ring. Based on the switches that are closed, voltages are generated on the first and second output voltage nodes, thereby providing a differential output voltage.

Figure 7:
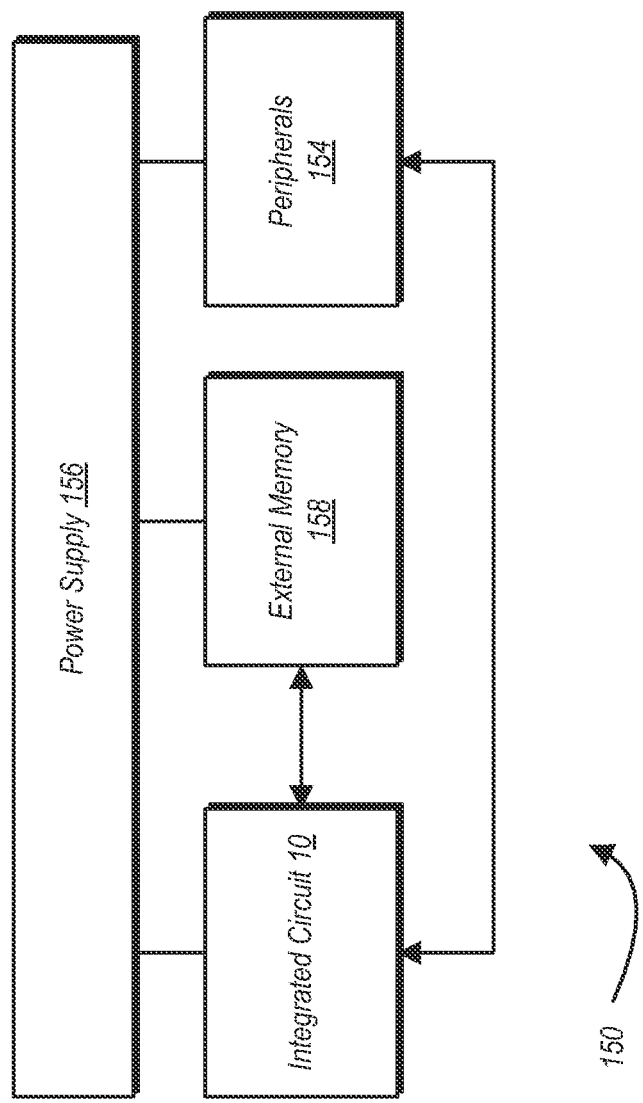
FIG. 7 is a block diagram of one embodiment of an exemplary system.

Turning next to FIG. 7, a block diagram of one embodiment of a system 150 is shown. In the illustrated embodiment, the system 150 includes at least one instance of the integrated circuit 10 coupled to external memory 158. The integrated circuit 10 is coupled to one or more peripherals 154 and the external memory 12. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

Numerous variations and modifications will become apparent to those skilled in the art once the above disclosure is fully appreciated. It is intended that the following claims be interpreted to embrace all such variations and modifications.

What is claimed is:

1. A digital-to-analog converter (DAC) comprising:
a plurality of resistor networks coupled together in series to form a ring; and
a decoder configured to, based on a plurality of most significant bits of a digital code, couple first and second reference voltage nodes to the ring by closing first and second selected ones of a first plurality of switches;
wherein the decoder is further configured to, based on a plurality of least significant bits of the digital code, couple a first output voltage node to the ring by closing a selected one of a second plurality of switches and couple a second output voltage node to the ring by closing a selected one of a third plurality of switches, wherein the decoder is configured to receive an N bit digital code having M most significant bits and L least significant bits, wherein plurality of resistor networks includes $2^{M+1}-2$ resistor segments and two output networks each including $2^L+1$ resistor;
wherein a differential output voltage provided by the DAC is based on the selected ones of the first, second, and third pluralities of switches that are closed.

2. The DAC as recited in claim 1, wherein a first one of the output networks is arranged as a first one-hot multiplexer configured to couple the first output voltage node to the ring by closing the selected one of the second plurality of switches, and wherein a second one of the output networks is arranged as a second one-hot multiplexer configured to couple the second output voltage node to the ring by closing the selected one of the third plurality of switches.

3. The DAC as recited in claim 2, wherein each of the first and second one-hot multiplexers is a $2^L$-to-1 multiplexer.

4. The DAC as recited in claim 1, wherein each of the $2^M-2$ resistor segments includes $2^L+1$ resistors.

5. A method comprising:
providing an N-bit digital code to a decoder, wherein the N-bit digital code includes M most significant bits and L least significant bits;
coupling first and second reference voltage nodes of a digital-to-analog converter (DAC) to a plurality of resistor networks coupled together in series to form a ring, wherein said coupling comprises closing, respectively, first and second selected ones of a first plurality of switches based on a plurality of the M most significant bits of the N-bit digital code;
coupling, based on a plurality of the L least significant bits of the digital code, a first output voltage node of the DAC to the ring by closing a selected one of a second plurality of switches;
coupling, based on the plurality of the L least significant bits of the digital code, a second output voltage node of the DAC to the ring by closing a selected one of a third plurality of switches; and
providing a differential output voltage from the first and second output voltage nodes based on selected ones of the first, second, and third plurality of switches closed responsive to the digital code; wherein the first plurality of switches includes a first subset having $2^M$ switches and a second subset having $2^M$ switches, and wherein the method further comprises the decoder closing, based on the M most significant bits, a selected one of the $2^M$ switches of the first subset and a selected one of the $2^M$ switches of the second subset.

6. The method as recited in claim 5, wherein the DAC includes a first output circuit coupled to the first output node, the first output circuit implementing a first one-hot multiplexer including the second plurality of switches, and wherein the DAC further includes a second output circuit coupled to the second output node, the second output circuit implementing a second one-hot multiplexer including the third plurality of switches, wherein each of the first and second one-hot multiplexers is a $2^L$-to-1 one-hot multiplexer, and wherein each of the first and second pluralities of switches includes $2^L$ switches.

7. The method as recited in claim 6, further comprising the decoder closing a selected one of the $2^L$ switches of the first one-hot multiplexer based on the L least significant bits and closing a selected one of the $2^L$ switches of the second one-hot multiplexer based on the L least significant bits.

8. A digital-to-analog (DAC) circuit comprising:
a first plurality of resistors coupled together in series;
a first plurality of switches each coupled between a first reference voltage node and a corresponding tap point in the first plurality of resistors;
a second plurality of resistors coupled together in series;
a second plurality of switches each coupled between a second reference voltage node and a corresponding tap point in the second plurality of resistors;
a first output circuit coupled in series between the first plurality of resistors and the second plurality of resistors, wherein the first output circuit includes a third plurality of resistors coupled in series and a third plurality of switches each coupled between a corresponding tap point and a first voltage output node; and
a second output circuit coupled in series between the first plurality of resistors and the second plurality of resistors, wherein the second output circuit includes a fourth plurality of resistors coupled in series and a fourth plurality of switches each coupled between a corresponding tap point and a first voltage output node.

9. The DAC as recited in claim 8, further comprising:
a decoder configured to receive a digital code and configured to cause a first and second output voltages of a differential output voltage to be generated on the first and second output voltage nodes, respectively, by closing one each of the first, second, third, and fourth pluralities of switches based on the digital code;
wherein the digital code is an N bit code having M most significant bits and L least significant bits.

10. The DAC as recited in claim 9 wherein the first plurality of switches includes $2^M/2$ switches each coupled to a corresponding tap point in one of the first plurality of resistors or second plurality of resistors, and wherein the second plurality of switches includes $2^M/2$ switches each coupled to a corresponding tap point in one of the first plurality of resistors or second plurality of resistors.

11. The DAC as recited in claim 9, wherein the first plurality of switches includes $2^M$ switches each coupled to a corresponding tap point in the first plurality of resistors and $2^M/2$ switches each coupled to a corresponding tap point in the second plurality of resistors, and wherein the second plurality of switches includes $2^M$ switches each coupled to a corresponding tap point in the second plurality of resistors and $2^M/2$ switches each coupled to a corresponding tap point in the first plurality of resistors.

12. The DAC as recited in claim 9, wherein the first plurality of switches includes $2^M$ switches each coupled to a corresponding tap point in the first plurality of resistors and wherein the second plurality of switches includes $2^M$ switches each coupled to a corresponding tap point in the second plurality of resistors.

13. A digital-to-analog converter (DAC) circuit comprising:
a plurality of resistor networks coupled in series to form a ring; and
a decoder circuit configured to receive a digital code having a plurality of most significant bits and a plurality of least significant, wherein the decoder circuit is configured to:
based on the plurality of most significant bits, couple a first voltage reference node to the ring by closing a selected one of a first plurality of switches, and further configured to couple a second reference voltage to the ring by closing a selected one of a second plurality of switches; and
based on the plurality of least significant bits, couple a first output voltage node to the ring by closing a selected one of a third plurality of switches, and couple a second output voltage node to the ring by closing a selected one of a fourth plurality of switches.

14. The DAC as recited in claim 13, wherein the decoder is an N-bit decoder, and wherein the DAC is configured to provide, via the first and second output voltage nodes, a differential output voltage corresponding to the digital code received by the decoder circuit.

15. The DAC as recited in claim 14, wherein the digital code is an N-bit code having M most significant bits and L least significant bits, wherein the first and second pluralities of switches each include $2^M$ switches.

16. The DAC as recited in claim 15, wherein the first output voltage node is coupled to the ring by a first $2^L$-to-1 multiplexer, and wherein the second output voltage node is coupled to the ring by a second $2^L$-to-1 multiplexer.

17. The DAC as recited in claim 16, wherein the plurality of resistor networks includes $2^M-2$ resistor segments and the first and second output networks each associated with a corresponding one of first and second $2^L$-to-1 multiplexers, wherein each the output networks includes $2^L+1$ resistors.

18. A digital-to-analog converter (DAC) comprising:
a plurality of resistor networks coupled together in series to form a circular topology, wherein the plurality of resistor networks includes a first subset of resistor networks and a second subset of resistor networks;
a first plurality of switches each configured to, when closed, couple a corresponding one of the first subset of resistor networks to a first reference voltage; and
a second plurality of switches each configured to, when closed, couple a corresponding one of the second subset of resistor networks to a second reference voltage;
wherein the first subset of resistor networks includes a first output circuit having a third plurality of switches, wherein the first output circuit is configured to provide a first output voltage based on closing one of the first plurality of switches and one of the third plurality of switches; and
wherein the second subset of resistor networks includes a second output circuit having a fourth plurality of switches, wherein the first output circuit is configured to provide a second output voltage based on closing one of the second plurality of switches and one of the fourth plurality of switches.

19. The DAC as recited in claim 18, further comprising an N-bit decoder coupled to receive an N-bit digital code, the N-bit digital code including M most significant bits and L least significant bits, wherein the DAC is configured to generate a differential output voltage corresponding to the N-bit digital code via the first and second output voltage nodes, and wherein the N-bit decoder is configured to cause one each of the first, second, third and fourth pluralities of switches to be closed in order to generate the differential output voltage.

20. The DAC as recited in claim 19, wherein the first subset of resistor networks includes $2^M$ resistor networks, and wherein the second subset of resistor networks includes $2^M$ resistor networks.

21. The DAC as recited in claim 20, wherein the first plurality of switches includes $2^M$ switches each coupled to a corresponding one of a first plurality of tap points in the first subset of resistor networks, and wherein the second plurality of switches includes $2^M$ switches each coupled to a corresponding one of a second plurality of tap points in the second subset of resistor networks.

22. The DAC as recited in claim 21, wherein the first output circuit is a first one-hot multiplexer having $2^L+1$ resistors and the third plurality of switches, and wherein the second output circuit is a second one-hot multiplexer having $2^L+1$ resistors and the fourth plurality of switches.

* * * * *

UNITED STATES PATENT AND TRADEMARK OFFICE
CERTIFICATE OF CORRECTION

PATENT NO. : 8,717,216 B1
APPLICATION NO. : 13/712306
DATED : May 6, 2014
INVENTOR(S) : Ali Motamed It is certified that error appears in the above-identified patent and that said Letters Patent is hereby corrected as shown below:

In the Claims:

Claim 17, Column 10, Line 6, please delete "$2^{M}-2$" and substitute -- $2^{M+1}-2$ --

Signed and Sealed this
Twenty-sixth Day of August, 2014

Michelle K. Lee
*Deputy Director of the United States Patent and Trademark Office*